(12) United States Patent
Suzuki et al.

(10) Patent No.: US 7,193,328 B2
(45) Date of Patent: Mar. 20, 2007

(54) SEMICONDUCTOR DEVICE

(75) Inventors: Takehiro Suzuki, Nara (JP); Kenji Toyosawa, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/166,076

(22) Filed: Jun. 11, 2002

(65) Prior Publication Data

US 2003/0006509 A1 Jan. 9, 2003

(30) Foreign Application Priority Data

Jul. 5, 2001 (JP) .............................. 2001-205121

(51) Int. Cl.
*H01L 23/48* (2006.01)

(52) U.S. Cl. ...................... 257/778; 257/777; 257/676; 257/711; 257/717; 257/779; 257/780; 257/668; 257/678; 257/689; 257/782

(58) Field of Classification Search ................ 257/778, 257/777, 676, 711, 717, 780, 668, 779, 678, 257/679, 689, 782
See application file for complete search history.

(56) References Cited

U.S. PATENT DOCUMENTS

| 5,263,243 | A | * | 11/1993 | Taneda et al. ................. 29/830 |
| 5,510,758 | A | | 4/1996 | Fujita et al. |
| 5,616,520 | A | * | 4/1997 | Nishiuma et al. ............ 438/125 |
| 5,804,882 | A | * | 9/1998 | Tsukagoshi et al. ......... 257/783 |
| 5,895,965 | A | * | 4/1999 | Tanaka et al. ............... 257/668 |
| 6,088,901 | A | * | 7/2000 | Huber et al. ................ 29/469.5 |
| 6,258,449 | B1 | | 7/2001 | Nagasawa et al. |
| 6,617,521 | B1 | | 9/2003 | Saito et al. |
| 6,853,086 | B1 | * | 2/2005 | Nakayama ................... 257/778 |

FOREIGN PATENT DOCUMENTS

| CN | 1198012 A | 11/1998 |
| EP | 0 869 548 A1 | 10/1998 |
| JP | 61-156239 | 9/1986 |
| JP | 01-286430 | 11/1989 |
| JP | 08-037208 | 2/1996 |
| JP | 08-067976 | 3/1996 |
| JP | 09-092683 | * 4/1997 |
| JP | 11-354684 | 12/1999 |
| JP | 2000-286309 A | 10/2000 |
| JP | 2000-294896 | 10/2000 |
| JP | 2000-340617 | 12/2000 |

* cited by examiner

*Primary Examiner*—Douglas W. Owens
*Assistant Examiner*—Junghwa Im
(74) *Attorney, Agent, or Firm*—Birch, Stewart, Kolasch & Birch, LLP

(57) ABSTRACT

Provided is a semiconductor device which prevents displacement of a semiconductor element and a wiring pattern of a wiring substrate so as to ensure the connection of the semiconductor element and the wiring pattern. The semiconductor device of the present invention includes a semiconductor element and a wiring substrate which is provided with a film substrate and a wiring pattern which is formed on the film substrate, the semiconductor element is connected to the wiring pattern, and the semiconductor element and the wiring substrate are sealed with a resin. A metallic film, made of material having a smaller coefficient of linear thermal expansion than the film substrate, is formed in a region where the wiring pattern is not formed on at least one surface of the film substrate.

22 Claims, 9 Drawing Sheets

SEMICONDUCTOR DEVICE

FIELD OF THE INVENTION

The present invention relates to a semiconductor device for use in electronic apparatuses such as a portable telephone, a personal digital assistant, and a liquid crystal display panel.

BACKGROUND OF THE INVENTION

In recent years, significant progress has been made toward reductions in size, thickness, and weight of electronic apparatuses such as a portable telephone, a personal digital assistant, a liquid crystal display panel, and a notebook computer. Accordingly, a similar progress has been made toward reductions in size and weight and increase in performance and density with respect to various parts, which such apparatuses carry, such as a semiconductor device.

In the above situation, the semiconductor device currently realizes reduction in weight by use of a substrate in a film form, and further reduction in size and thickness by increase in density of semiconductor elements mounted on the substrate in the film form. The mounting method is called a COF (Chip on FPC) method.

Here, referring to FIGS. 6 through 9, a conventional semiconductor device by the above COF method is described as follows.

As shown in FIG. 6, the conventional semiconductor device includes a semiconductor element 18 and a wiring substrate 16. In the semiconductor element 18, a plurality of electrodes is formed. The electrode is provided with an aluminum pad 12 which is formed on the semiconductor element 18, and a bump electrode (Au bump) 13 which is formed on the aluminum pad 12. As shown in FIG. 7, a wiring substrate 16 is composed of a film substrate 14 on which a wiring pattern 15 is formed. The wiring pattern 15 is formed in the position corresponding to the Au bump 13. Also, the Au bump 13 and the wiring pattern 15 are connected to each other.

Here, referring to FIG. 8, a method for manufacturing the above semiconductor device is described below.

First, the semiconductor element 18 is aligned with respect to the wiring substrate 16. That is, the Au bump 13 is aligned so as to be at a predetermined position of the corresponding wiring pattern 15. Next, connection (joint) of the Au bump 13 and the wiring pattern 15 is made by thermo-compression bonding, by using a bonding tool 19. Then, the semiconductor element 18 and the wiring substrate 16 are sealed with a resin.

As described above, the thermo-compression bonding is currently a popular method of connecting the Au bump 13 and the wiring pattern 15 in the semiconductor device. However, in the thermo-compression bonding, a thermal stress is added to the film substrate 14 and the wiring pattern 15 in the wiring substrate 16. The thermal stress makes the film substrate 14 and the wiring pattern 15 to expand and contract (actually, they expand due to addition of heat) in accordance with respective coefficients of linear thermal expansion. At this point, since the film substrate 14 has a larger coefficient of linear thermal expansion than the wiring pattern 15, the film substrate 14 tries to make a larger expansion than the wiring pattern 15 does.

However, the wiring pattern 15 is formed on the film substrate 14, so that the wiring pattern 15 makes a larger expansion, following an expansion degree of the film substrate 14 (being pulled by the expansion of the film substrate 14). Conversely, the film substrate 14 makes a small expansion, following an expansion degree of the wiring pattern 15. That is, the stability of dimension of the wiring substrate 16 is not excellent because the wiring pattern 15 makes displacement, resulting in displacement with the Au bump 13. Therefore, this causes a problem of a deficiency of connection of the Au bump 13 and the wiring pattern 15.

Further, by change in temperature of the thermo-compression bonding, the displacement is corrected in accordance with a satisfactory dimension of the wiring substrate 16 of which dimension varies during manufacture so that the semiconductor element 18 and the wiring substrate 16 can be connected. However, in this case, it is necessary to change the temperature for each wiring substrate 16, thereby decreasing the efficiency in manufacture.

Further, as shown in FIG. 7, in the wiring substrate 16, a semiconductor element setting position 17 (a part surrounded by a dotted line), which is a position where the semiconductor element 18 (see FIG. 6) is set, has no wiring pattern other than a part where the Au bump 13 (see FIG. 6) is connected. That is, there is no wiring pattern in an inner part of the wiring pattern 15, and the film substrate 14 is bare. In the inner part of the wiring pattern 15, addition of a thermal stress makes the film substrate 14 to expand more than a part where the wiring pattern 15 is formed, thereby causing wrinkles. There is a problem that such a semiconductor device having wrinkles is judged as inferior goods by visual inspection. Further, another problem is that there is a possibility that the wrinkles gather moistures, and such moistures produce erosion in the vicinity of the Au bump 13, thereby causing a poor connection of the semiconductor element 18 and the wiring substrate 16.

In this regard, Japanese Unexamined Patent Application No. 2000-286309 (tokukai 2000-286309, published on Oct. 13, 2000) discloses a wiring substrate which prevents deformation (warping) by expansion and contraction caused by heat. As shown in FIG. 9, the wiring substrate 16 includes the bending wiring pattern 15 (having parts which extend in a first direction and second direction) formed on the film substrate 14. The bending wiring pattern supports the expansion of the film substrate 14 in a plurality of directions so as to reduce a warping by the expansion of the film substrate 14. Further, the above wiring substrate 16 is connected to the semiconductor element through inner leads (a part of the wiring pattern 15) 22, which is projected toward a device hole 21. Since a region where the wrinkles are made is the device hole 21, a poor connection therefore is not caused by wrinkles.

However, in the wiring substrate described in the Japanese Unexamined Patent Application No. 2000-286309, a bending wiring pattern is not formed in the vicinity of parts where the semiconductor element is connected. Due to a thermal stress, the wiring pattern 15 therefore cannot support the expansion of the film substrate 14 in a plurality of directions in the vicinity of parts where the semiconductor element is connected. This causes the expansion of the wiring substrate 16 (film substrate 14), thereby causing displacement of the inner leads 22. The displacement makes it impossible to ensure connection of the semiconductor element to the inner lead 22, resulting in a deficiency of connection (faulty electrical continuity).

SUMMARY OF THE INVENTION

An object of the present invention is to provide a semiconductor device which increases the stability of dimension of a wiring substrate and prevents the displacement of a semiconductor element and a wiring pattern of the wiring substrate so as to ensure the connection of the semiconductor and the wiring pattern.

In order to achieve the above object, the semiconductor device of the present invention includes:

(a) a semiconductor element; and (b) a wiring substrate which is provided with: a film substrate and a wiring pattern which is formed on the film substrate, the semiconductor element being connected to the wiring pattern, and the semiconductor element and the wiring substrate being sealed with a resin, wherein a reinforcing film, made of material having a smaller coefficient of linear thermal expansion than the film substrate, is formed in a region where the wiring pattern is not formed on at least one surface of the film substrate.

According to the above arrangement, since the reinforcing film is formed on the film substrate, the expansion of the film substrate is limited by a smaller expansion of the reinforcing film. In other words, the reinforcing film limits the expansion of the film substrate. This makes it possible to improve the stability of dimension of the wiring substrate. Accordingly, displacement of the semiconductor element and the wiring pattern is reduced, and it is possible to provide the semiconductor device which ensures connection of the semiconductor element and the wiring pattern. Further, as described above, since the provided reinforcing film makes resistant to the expansion of the film substrate, thereby preventing occurrence of wrinkles in the film substrate.

For a fuller understanding of the nature and advantages of the invention, reference should be made to the ensuing detailed description taken in conjunction with the accompanying drawings.

DESCRIPTION OF THE EMBODIMENTS

Referring to FIGS. 1 through 5, a semiconductor device according to an embodiment of the present invention is described as follows. Note that, conditions in each process adopted in the present embodiment are the same as those in a manufacturing method (mounting process) of the conventional semiconductor integrated circuit (semiconductor element), and a specific explanation thereof is omitted except for a special case.

Figure 1:
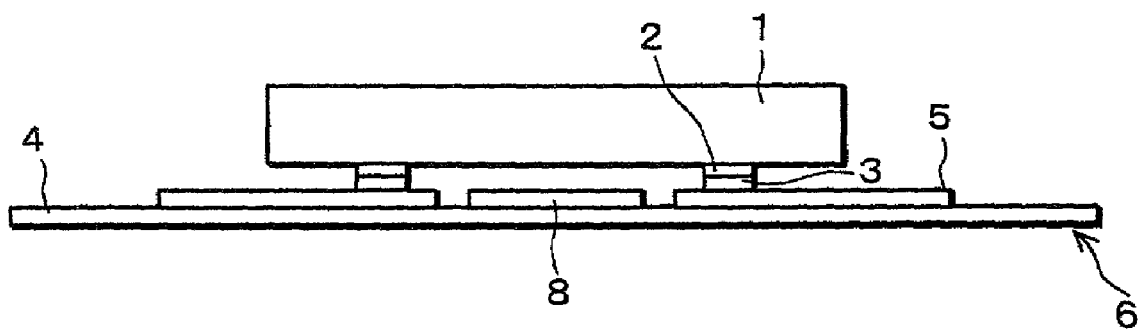
FIG. 1 is a sectional view of a principle part of a semiconductor device according to an embodiment of the present invention.
Figure 2:
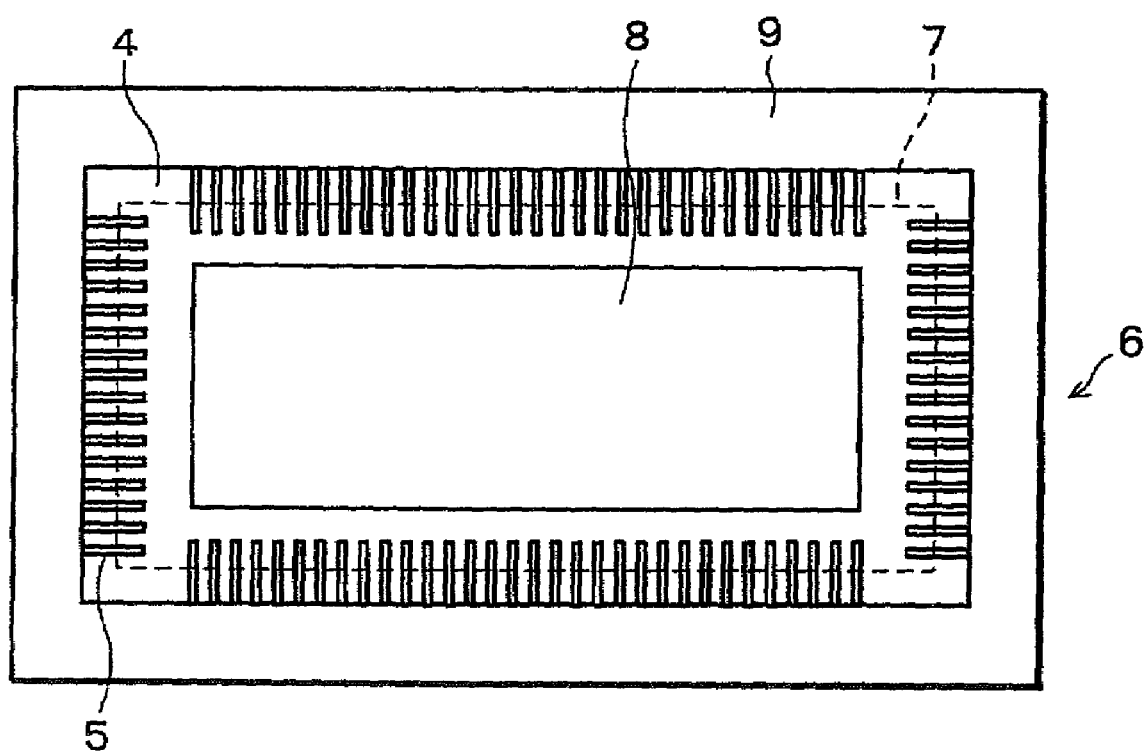
FIG. 2 is a plan view of a wiring substrate of the above semiconductor device.

As shown in FIG. 1, the semiconductor device according to the present embodiment has a semiconductor element 1 and a wiring substrate 6. The semiconductor element 1 is provided with a plurality of electrodes for input and output. The electrode is provided with a pad 2 which is formed on the semiconductor element 1, and a bump electrode (Au bump) 3 which is formed on the pad 2. As shown in FIG. 2, the wiring substrate 6 is composed of a film substrate 4 on which a metallic film (reinforcing film) 8 and a wiring pattern 5 are formed. The wiring pattern 5 is formed at the position corresponding to the Au bump 3. The wiring pattern 5 is composed of an inner lead which is a connecting section to the semiconductor element 1, an outer lead which is a connecting section to electronic apparatuses such as a liquid crystal display panel, and a middle lead which connects the inner lead and the outer lead. Also, the Au bump 3 and the wiring pattern (inner lead) 5 are connected to each other. This connecting method is generally called ILB (Inner Lead Bonding).

The metallic film 8 is formed at a part (region) (here, its shape is rectangle) where the wiring pattern is not formed in a semiconductor element setting position 7 (a part surrounded by a dotted line) of the wiring substrate 6. Further, in the regions other than the semiconductor element setting position 7 and the outer lead of the wiring pattern 5, a protecting film 9 is formed.

The above semiconductor element 1 controls driving operations of electronic apparatuses which carry the semiconductor device (e.g. a liquid crystal display panel, a portable telephone, and a notebook computer). The pad 2 is made of an electrically conductive material such as aluminum. The bump electrode 3 has a thickness of the order of 10 μm to 18 μm and is made of an electrically conductive material such as gold (Au). The film substrate 4 is made of insulating material, which is a main material, such as polyimide resin and polyester resin. The wiring pattern 5 has a thickness of the order of 10 μm to 20 μm and is made of a metallic material such as copper (Cu). The metallic film 8 is made of material which has a smaller coefficient of linear thermal expansion than the film substrate 4, for example, a metallic material such as copper. More specifically, the wiring pattern 5 and the metallic film 8 are formed in such a way that the film substrate 4 is laminated to copper foil with an adhesive, and the copper foil is etched. The protecting film 9 is made of an insulating material such as solder resist to protect the wiring pattern 5 from disadvantages such as oxidation.

Figure 8:
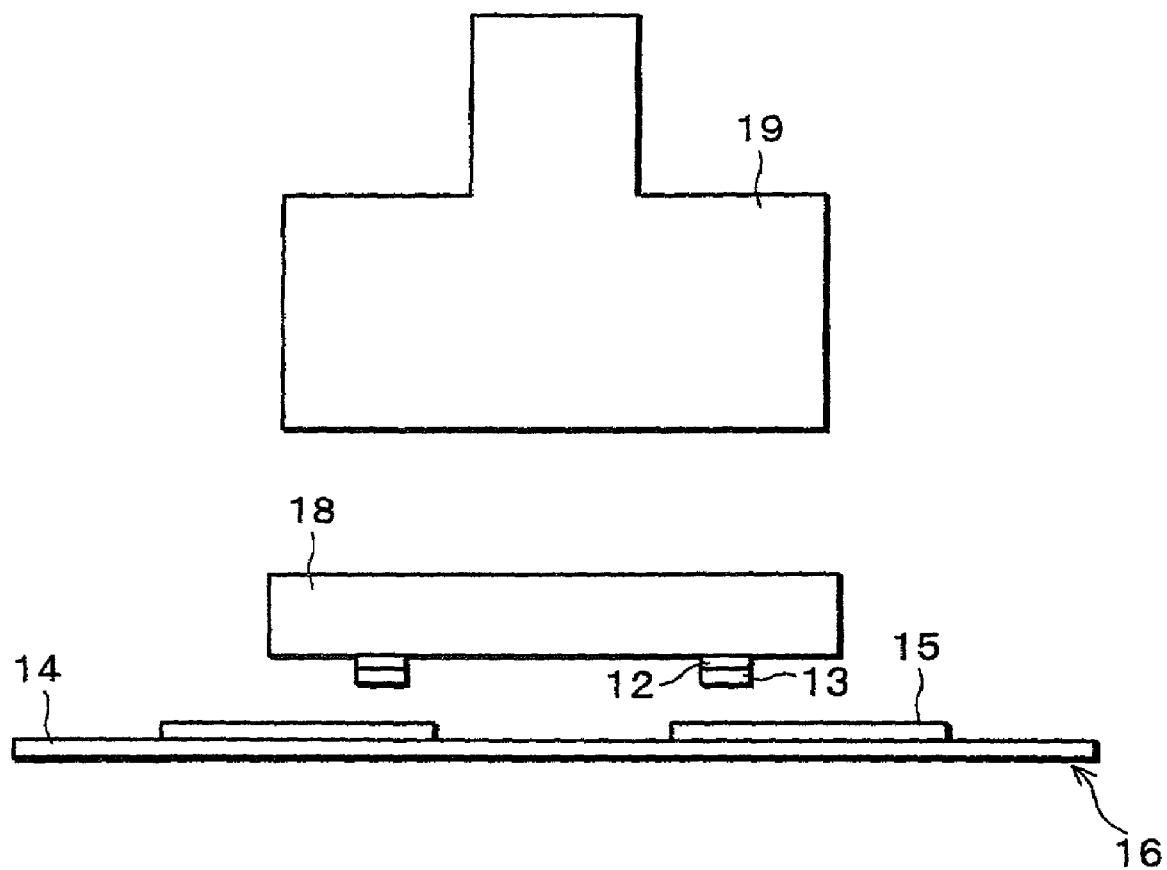
FIG. 8 is a sectional view for explaining a method for manufacturing the conventional semiconductor device.
Figure 9:
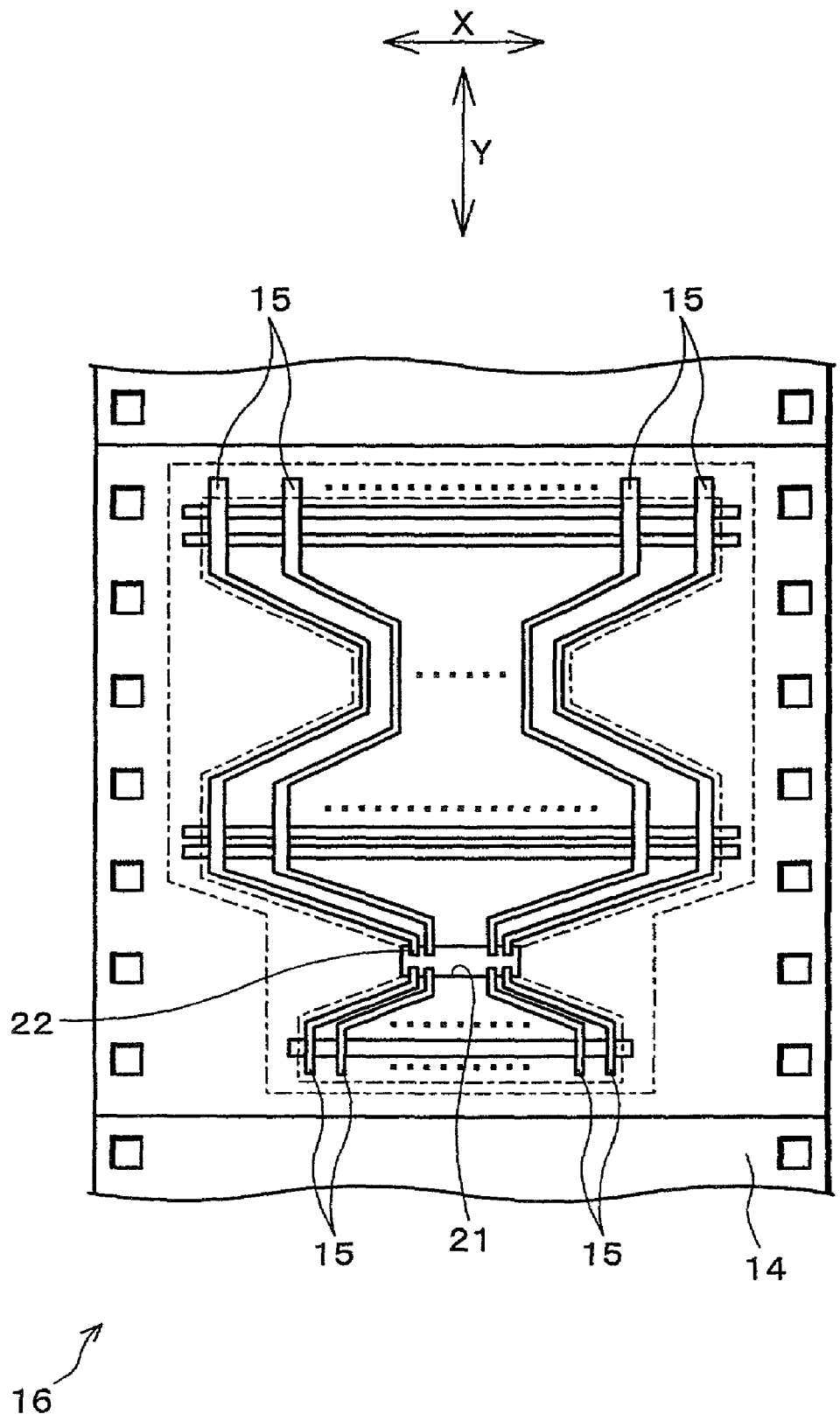
FIG. 9 is a plan view of the conventional wiring substrate.

The following will describe a manufacturing method of a semiconductor device according to an embodiment of the present invention, that is, a method of mounting of the semiconductor element 1 to the wiring substrate 6. Note that, the manufacturing method is the same as that of the semiconductor device described in the above background of the invention (FIG. 8).

First, the semiconductor element 1 is aligned with respect to the wiring substrate 6. More specifically, the Au bump 3 is aligned so as to be at a predetermined position of the corresponding wiring pattern 5 (a position of the corresponding inner leads). Next, connection (joint) of the Au bump 3 and the wiring pattern (inner leads) 5 is made by thermo-compression bonding by using a bonding tool. That is, the ILB is performed.

After the ILB, the semiconductor element 1 and the wiring substrate 6 are sealed with a thermosetting resin (resin) such as epoxy resin and silicone resin. For example, the resin sealing is performed as follows: The above resin is applied (dropped) by a nozzle to one side, two sides, or three sides surrounding the semiconductor element 1 (it is impossible to seal four sides because there is no escape routs of air). Then, the resin is flown between the semiconductor element 1 and the wiring substrate 6, and cured by methods such as a reflow method. The above resin may be an ultraviolet-curing resin. In this case, an ultraviolet is projected to cure the resin.

As described above, according to the semiconductor device of the present invention, the metallic film 8 is formed in a region where the wiring pattern is not formed in the semiconductor element setting position 7 as shown in FIG. 2. At this point, the film substrate 4 is made of a material such as polyimide resin and polyester resin, and the metallic film 8 is made of metallic material such as copper. Because of the characteristics of these materials (the material such as polyimide resin and polyester resin has a larger coefficient of linear thermal expansion than the metallic material such as copper), the film substrate 4 has a larger value in coefficient of linear thermal expansion than the metallic film 8. With this, when the same degree of a thermal stress is added to the film substrate 4 and the metallic film 8, the film substrate 4, having a larger coefficient of linear thermal expansion, expands and contracts more than the metallic film 8 (here, they expand due to addition of heat).

However, since the film substrate 4 is bonded to the metallic film 8, the expansion of the film substrate 4 is limited by the smaller expansion of the metallic film 8. This allows the metallic film 8 to limit the expansion of the film substrate 4, thereby improving the stability of dimension of the wiring substrate 6. Moreover, the displacement of the semiconductor 1 and the wiring substrate 6, that is, the displacement of the Au bump 3 and the wiring pattern (inner lead) 5 can be reduced. The poor connection of the Au bump 3 and the wiring pattern (inner lead) 5 can be reduced. Performing an excellent ILB is therefore possible.

The following gives a specific example. The above film substrate 4 has a coefficient of linear thermal expansion of the order of 20 ppm/K. On the other hand, the coefficient of linear thermal expansion of the film substrate 4 provided with the metallic film 8 decreases to the order of 15 ppm/K. From this example, it is found that the film substrate 4 becomes actually resistant to expanding when the heat is added to the film substrate 4. That is, the stability of dimension of the wiring substrate 6 is improved.

Further, in the region where the above metallic film is not formed in the film substrate 4, there is a possibility that wrinkles occur due to a difference in expansion between the film substrate 4 and the wiring pattern 5. However, formation of the metallic film 8 makes the film substrate 4 resistant to expanding, and this makes it possible to prevent the occurrence of wrinkles with respect to the film substrate 4.

Further, the above metallic film 8 can shield light (α rays) which comes from outside and falls on the surface of the semiconductor element 1 through the film substrate 4. Accordingly, it is possible to prevent a false action of the semiconductor device, caused by α rays falling on the surface of the semiconductor element 1.

It is preferable that the wiring pattern 5 and the metallic film 8 are made of the same material. This makes it easy to form the wiring pattern 5 and the metallic film 8 at the same time, thereby increasing the efficiency in manufacture. Also, it is possible to form the metallic film 8 at a low cost without necessity for providing new manufacturing processes.

It is preferable that the wiring pattern 5 and the metallic film 8 are formed in the same forming method (the same process). This makes it easier to form the wiring pattern 5 and the metallic film 8 at the same time, thereby increasing the efficiency more in manufacture. Also, it is possible to form the metallic film 8 at a lower cost without necessity for providing new manufacturing processes.

If the wiring pattern 5 and the metallic film 8 are formed at the equivalent thickness, it is easy to form them at the same time, thereby increasing the efficiency more in manufacture. Note that, "the equivalent thickness" means that the wiring pattern 5 and the metallic film 8 have substantially the same thickness. Also, it is possible to form the metallic film 8 at a lower cost without necessity for providing new manufacturing processes.

Further, it is preferable that the thickness of the metallic film 8 is not more than that of the wiring pattern 5. Note that, the wiring pattern 5 may have substantially the same thickness as the metallic film 8. Here, there is a possibility that the semiconductor element 1 make contact with the metallic film 8 when being connected to the wiring substrate 6. However, if the protecting film is formed on the surface of the semiconductor element 1, the semiconductor element 1 does not suffer breakage by a slight contact of the semiconductor element 1 and the metallic film 8. Also, since the thickness of the metallic film 8 is not more than that of the wiring pattern 5, between the semiconductor element 1 and the wiring substrate 6 is created a spacing of the thickness of the Au bump 3. This spacing facilitates flowing the resin between the semiconductor element 1 and the wiring substrate 6 in the resin sealing. Thus, it is possible to perform the resin sealing easily.

Further, it is preferable that the metallic film 8 has one-third to two-thirds of the thickness of the wiring pattern 5. If the metallic film 8 has less than one-third of the thickness of the wiring pattern 5, manufacture is difficult because it is too thin, and so much manufacture costs is required. Meanwhile, if the metallic film 8 has more than two-thirds of the thickness of the wiring pattern 5 (equivalent or close to the thickness of the wiring pattern 5), there is a possibility that the metallic film 8 makes contact with the semiconductor element 1 when the semiconductor element 1 was connected to the wiring substrate 6. Moreover, there is a possibility that the semiconductor element 1 suffers breakage due to a short when contacting with the metallic film 8. In other words, if the metallic film 8 has the above range of the thickness, its manufacture is easy, and the possibility declines that the semiconductor element 1 makes contact with the metallic film 8 and suffers breakage. Moreover, the amount of the metallic film 8 getting thinner produces a larger spacing between the semiconductor element 1 and the wiring substrate 6. This spacing helps the resin to flow more easily between the semiconductor 1 and the wiring substrate 6. It is therefore possible to perform the resin sealing more easily.

Further, it is preferable that the metallic film 8 is formed separately from the wiring pattern 5 and is not electrically connected thereto. The above metallic film 8 is the film to limit the expansion of the film substrate 4 due to the thermal stress and to arrange so as to improve the stability of dimension. The electrical connection of the metallic film 8 and the wiring pattern 5 is not therefore necessary.

Figure 3:
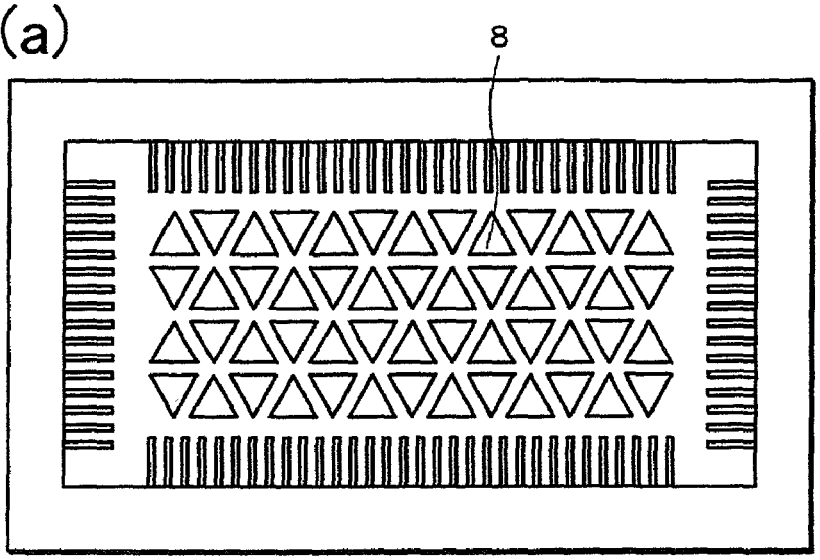
FIGS. 3(a) through (c) are plan views of a wiring substrate of a semiconductor device according to another embodiment of the present invention.
Figure 3:
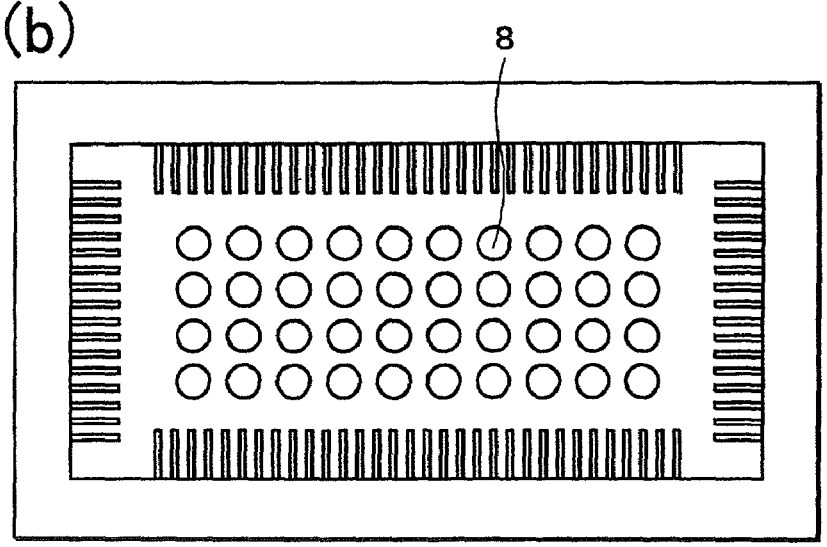
Figure 3:
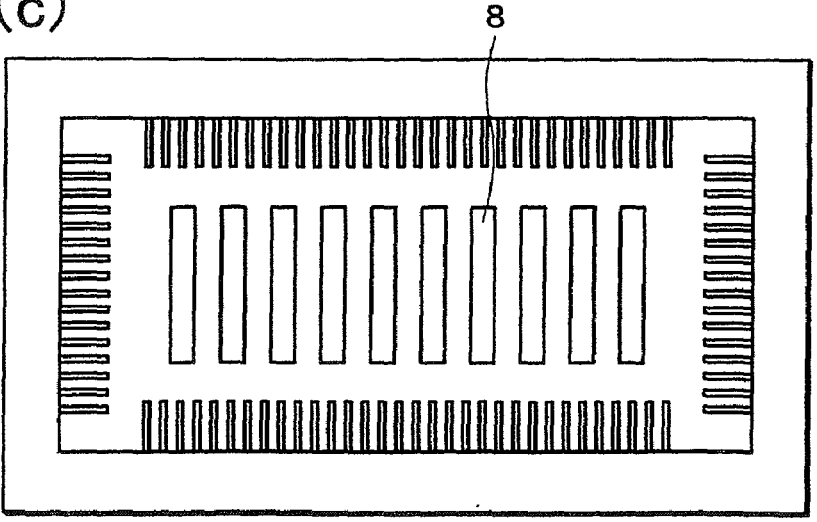

Further, instead of one rectangular metallic film 8, a plurality of triangular metallic films 8 may be formed as shown in FIG. 3(*a*).

As described above, by forming the plurality of metallic films 8, spacing is created between metallic films 8 adjacent to each other. The spacing becomes the channel of the resin in the resin sealing to facilitate the resin's flowing. This makes it possible to perform the resin sealing easily.

Further, it is preferable that intervals between the metallic films 8 adjacent to each other are larger than those between the wiring patterns 5 adjacent to each other.

This makes a larger spacing between the metallic films 8 adjacent to each other, thereby facilitating the resin's flowing more. Moreover, it is possible to flow enough amount of the resin in the spacing and to reduce the occurrence of such deficiencies that the resin sealing becomes poor.

Further, as shown in FIG. 3(b), a plurality of circular metallic films 8 may be formed. Moreover, a plurality of metallic films 8 may be formed in a striped manner. Still further, the shape of the metallic film may be quadrangle, rhombus, trapezoid, etc., which are not shown. As described above, in case where a plurality of metallic films is formed, it is preferable that several dozen to several hundred of films are aligned evenly. One metallic film may be formed in the above shapes.

Further, it is preferable that the above metallic films 8 are formed (aligned) so as to be symmetric with respect to a point or a line in the semiconductor element setting position 7. Here, the point-symmetry and line-symmetry is uniformly called symmetry.

The film substrate 4 usually makes a vertically and laterally symmetric expansion (expands equally in all the directions of a surface of the film substrate 4). However, formation of the metallic film 8 limits the expansion of the film substrate 4 in the region where the metallic film 8 is formed. Then, the alignment of the metallic films 8 as described above allows the region where the metallic film 8 is formed on the film substrate 4 to expand equally in all the directions. Accordingly, it is possible to make expanding directions even with respect to the whole film substrate 4, thereby preventing the occurrence of wrinkles, etc. more effectively.

In case where the shape of the metallic film 8 is triangle, it is preferable that the adjacent metallic films 8 are aligned so that one side (bottom) of the metallic film faces to that of other metallic film. Further, in case where the shape of the metallic film 8 is trapezoid, it is preferable that an upper side or a lower side of the film faces to that side of other metallic film.

Figure 4:
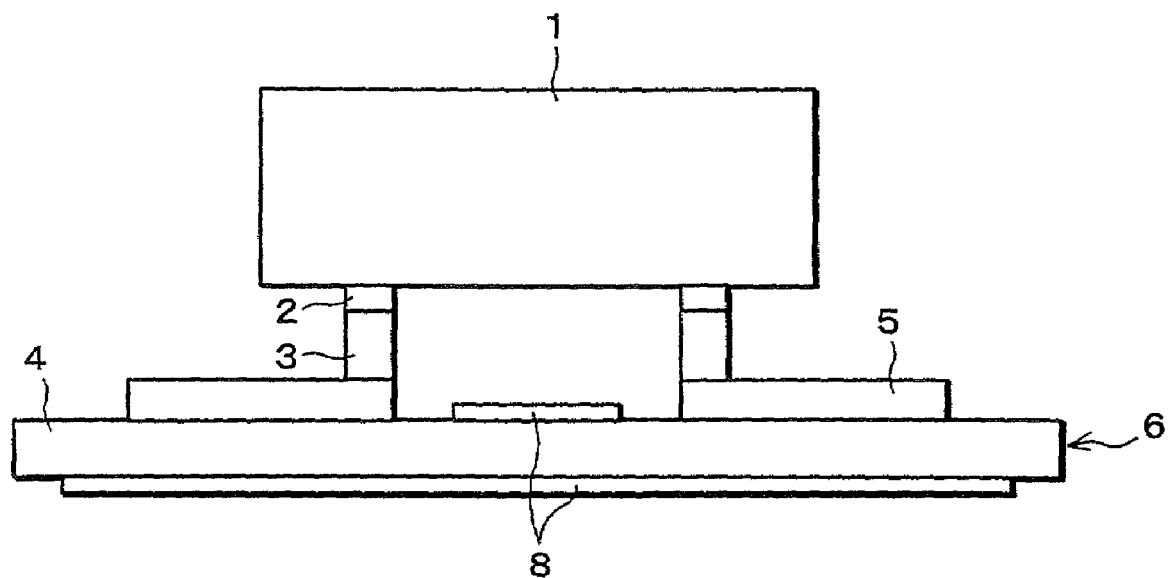
FIG. 4 is a plan view of a wiring substrate of a semiconductor device according to still another embodiment of the present invention.

As shown in FIG. 4, the above metallic films 8 may be formed on both surfaces of the film substrate 4. This makes it possible to more effectively limit the expansion and contraction of the film substrate 4, which is caused by the thermal stress, so that the poor connection of the wiring pattern 5 and the semiconductor element 1 can be reduced more effectively. The above metallic film 8 may be formed only on the surface where the wiring pattern of the wiring substrate 6 is not formed.

Figure 5:
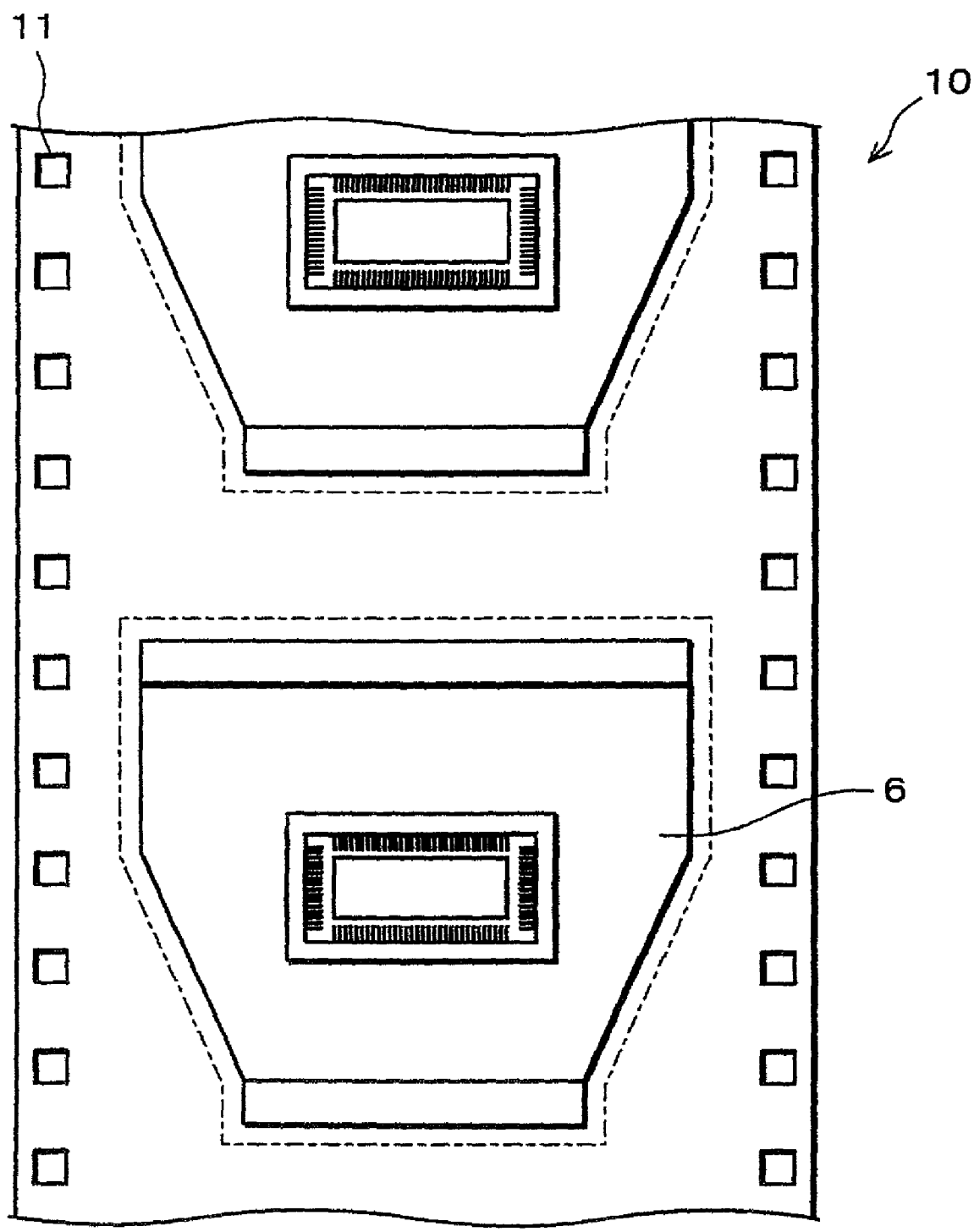
FIG. 5 is a plan view of a wiring substrate (tape carrier) of a semiconductor device according to still another embodiment of the present invention.
Figure 6:
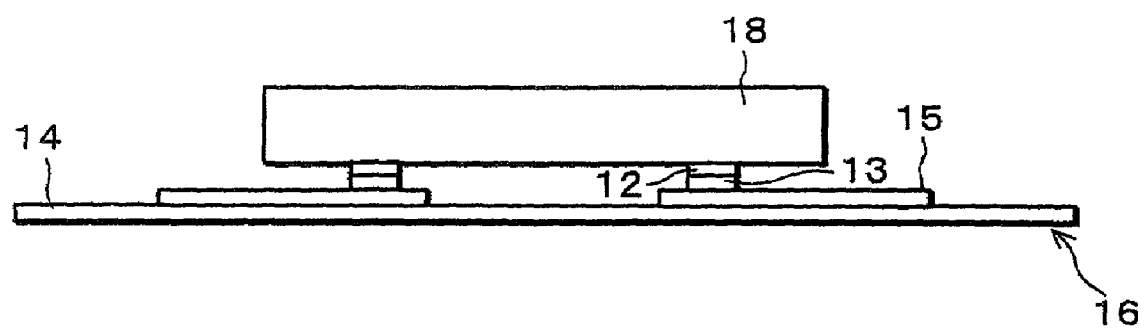
FIG. 6 is a sectional view of a principle part of the conventional semiconductor device.
Figure 7:
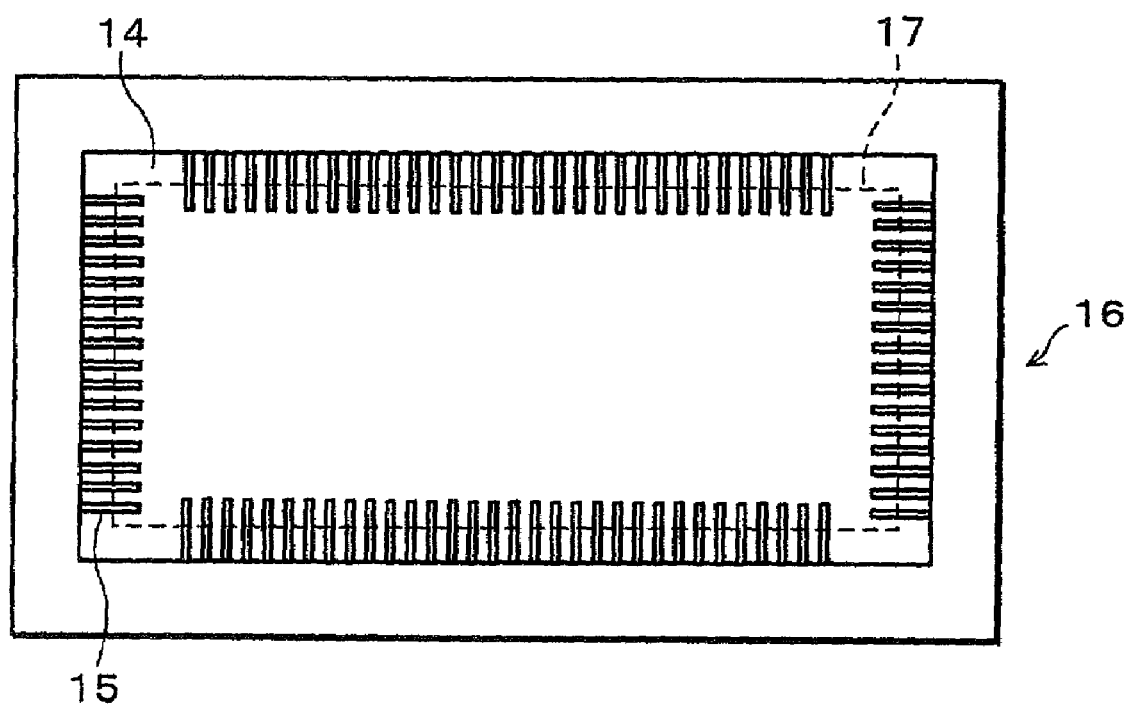
FIG. 7 is a plan view of a wiring substrate of the conventional semiconductor device.

As shown in FIG. 5, in case where the semiconductor devices are formed continuously, a tape carrier 10, in which (plural) wiring substrates 6 are formed aligning continuously, may be adopted. Here, it is defined that a direction in which the wiring substrates 6 are aligned is the longitudinal direction, and that a vertical direction to the longitudinal direction is the direction of the width.

The tape carrier 10 has feeding openings 11 on both ends of the direction of the width at predetermined intervals along the longitudinal direction. By moving the feeding openings 11 into mesh with a feeder (not shown), it is possible to move the tape carrier 10 in the longitudinal direction. With this, the continuous connection of the semiconductor element and the wiring substrate 6 can be made, thereby increasing the efficiency in manufacture of the semiconductor device.

The semiconductor elements are connected to the wiring substrates 6 of the tape carrier 10, and parts where the semiconductor elements are mounted (parts surrounded by a dotted line in FIG. 5) are punched from the tape carrier 10 by using a cutter, a punch, or the like. The punched ones become independent semiconductor devices. The semiconductor devices are mounted to electronic apparatuses.

As described above, the semiconductor device according to the present invention reduces the displacement of the wiring substrate 6 and the semiconductor element when being connected, so that the cumulative displacement with respect to the tape carrier 10 connecting continuously can also be reduced. Therefore, in case of a continuous mounting of the semiconductor elements, it is also possible to reduce the poor connection of the Au bump and the wiring pattern.

In addition to the above arrangement, in the semiconductor device of the present invention, it is preferable that the above reinforcing film is made of the same material as the wiring pattern.

The above arrangement makes it easy to form the wiring pattern and the reinforcing film at the same time, thereby increasing the efficiency in manufacture. Also, it is possible to form the reinforcing film at a low cost without necessity for providing new manufacturing processes.

Further, the above reinforcing film is made of the same material (for example, metal, etc.) as the wiring pattern, so that it is possible to shield light ($\alpha$ rays) which comes from outside and falls on the surface of the semiconductor element through the film substrate. Accordingly, it is possible to prevent a false action of the semiconductor device, which is caused by a rays falling on the surface of the semiconductor element.

In addition to the above arrangement, in the semiconductor device of the present invention, it is preferable that the above reinforcing film has a thickness which is not more than that of the wiring pattern.

According to the above arrangement, the thickness of the above reinforcing film is not more than that of the wiring pattern, so that spacing is created between the semiconductor element and the wiring substrate. The spacing helps the resin to flow between the semiconductor element and the wiring substrate in sealing. It is therefore possible to easily perform the sealing. Moreover, the distance becomes far between the semiconductor element and the reinforcing film, so that it is possible to prevent the semiconductor element and the reinforcing film from contacting. This makes it possible to prevent the breakage caused by the contact of the semiconductor element and the reinforcing film.

In addition to the above arrangement, in the semiconductor device of the present invention, it is preferable that the above reinforcing film has one-third to two-thirds of the thickness of the wiring pattern.

The above arrangement helps the resin to flow more between the semiconductor element and the wiring substrate, thereby performing the sealing more easily.

In addition to the above arrangement, in the semiconductor device of the present invention, it is preferable that a plurality of reinforcing films is formed independently on the film substrate.

According to the above arrangement, spacing is created between the reinforcing films adjacent to each other. The spacing becomes the channel of the resin in sealing to facilitate the resin's flowing more. This makes it possible to perform the sealing more easily.

In addition to the above arrangement, in the semiconductor device of the present invention, it is preferable that intervals between the reinforcing films adjacent to each other are larger than those between the wiring patterns adjacent to each other.

According to the above arrangement, a larger spacing is created between the reinforcing films adjacent to each other, thereby facilitating the resin's flowing more. Moreover, it is possible to easily flow enough amount of the resin in the spacing and to reduce the occurrence of such deficiencies that the resin sealing becomes poor.

In addition to the above arrangement, in the semiconductor device of the present invention, it is preferable that the reinforcing films are formed symmetrically on the film substrate.

According to the above arrangement, the reinforcing films are formed symmetrically (point-symmetrically or line-symmetrically), so that the region where the reinforcing films are formed on the film substrate expand equally in all the directions. Accordingly, it is possible to make expanding directions even with respect to the whole film substrate, thereby preventing the occurrence of wrinkles, etc. more effectively.

In addition to the above arrangement, in the semiconductor device of the present invention, it is preferable that the reinforcing films are formed on both surfaces of the wiring substrate.

According to the above arrangement, it is possible to more effectively limit the expansion and contraction of the film substrate, which is caused by the thermal stress, so that poor connection of the wiring pattern and the semiconductor element can be reduced more effectively.

In addition to the above arrangement, in the semiconductor device of the present invention, it is preferable that the reinforcing film has the shape of triangle, quadrangle, or circle.

In addition to the above arrangement, in the semiconductor device of the present invention, it is preferable that the reinforcing films have the shape of triangle or quadrangle, and the reinforcing films are adjacent with their one sides facing to each other.

To solve the above problem, a wiring substrate of the present invention may include:
 a film substrate having a wiring pattern; and
 a reinforcing film,
 wherein the reinforcing film, made of material having a smaller coefficient of linear thermal expansion than the film substrate, is formed in a region where the wiring pattern is not formed on the film substrate.

According to the above arrangement, since the reinforcing film is formed on the film substrate, the expansion of the film substrate is limited by a smaller expansion of the reinforcing film. In other words, the reinforcing film limits the expansion of the film substrate. This makes it possible to improve the stability of dimension of the wiring substrate.

Further, as described above, since the provided reinforcing film makes resistant to the expansion of the film substrate, thereby preventing occurrence of wrinkles in the film substrate.

In a tape carrier of the present invention, a plurality of wiring substrate described above may be formed on a tape.

According to the above arrangement, for example, in the manufacture of the semiconductor device, the continuous connection of the semiconductor element and the wiring substrate can be made, thereby increasing the efficiency in manufacture of the semiconductor device.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A semiconductor device comprising:
 (a) a semiconductor element, which is provided with a plurality of electrodes for input and output of an electric signal on the periphery of a bottom surface of the semiconductor element; and
 (b) a wiring substrate which is provided with:
  a film substrate,
  a wiring pattern formed on the film substrate and having at least one inner lead as a terminal portion, and
  a reinforcing film, made of material having smaller thermal expansion than the film substrate, and formed on at least one surface of the film substrate in a region of the wiring substrate where the wiring pattern is not formed and capable of substantially preventing the film substrate from expanding,
 wherein the semiconductor element is connected to the wiring pattern, and the semiconductor element and the wiring substrate are sealed with a resin,
 wherein said connection between the semiconductor element and the wiring pattern is a thermo-compressed bonded connection formed by thermo-compression bonding the electrodes of the semiconductor element to inner leads of the wiring pattern, the inner leads are aligned at positions corresponding to the respective electrodes,
 wherein said bonded connection is such that at least one inner lead of the wiring pattern directly contacts an electrode of the semiconductor element,
 wherein said reinforcing film is bonded onto the film substrate, and has sides, at least one of which extends along a direction in which the inner leads are provided, and
 wherein the height of the reinforcing film, measured from the surface of the film substrate on which the reinforcing film is formed, is one-third to two-thirds of the height of the wiring pattern.

2. The semiconductor device according to claim 1, wherein the reinforcing film is made of the same material as the wiring pattern.

3. A semiconductor device comprising:
 (a) a semiconductor element, which is provided with a plurality of electrodes for input and output of an electric signal on the periphery of a bottom surface of the semiconductor element; and
 (b) a wiring substrate which is provided with:
  a film substrate,
  a wiring pattern formed on the film substrate and having at least one inner lead as a terminal portion, and
  a plurality of reinforcing films, made of material having a smaller coefficient of linear thermal expansion than the film substrate, is formed on both surfaces of the wiring substrate independently in a region where the wiring pattern is not formed and capable of substantially preventing the film substrate from expanding,
 wherein the semiconductor element is connected to the wiring pattern, and the semiconductor element and the wiring substrate are sealed with a resin, wherein said connection between the semiconductor element and the wiring pattern is a thermo-compressed bonded connection formed by thermo-compression bonding the electrodes of the semiconductor element to inner leads of the wiring pattern, the inner leads are aligned at positions corresponding to the respective electrodes, wherein said bonded connection is such that at least one inner lead of the wiring pattern directly contacts an electrode of the semiconductor element, wherein the plurality of reinforcing films are bonded onto the film substrate, are facing the inner leads, and are disposed along a direction in which the inner leads are provided, and wherein each reinforcing film has one-third to two-thirds of the thickness of the wiring pattern.

4. The semiconductor device according to claim 3, wherein the reinforcing films are made of the same material as the wiring pattern.

5. The semiconductor device according to claim 3, wherein intervals between the reinforcing films adjacent to each other are larger than those between the wiring patterns adjacent to each other.

6. The semiconductor device according to claim 3, wherein the reinforcing films are formed symmetrically on the film substrate.

7. The semiconductor device according to claim 1, wherein the reinforcing film has a shape of triangle, quadrangle, or circle.

8. The semiconductor device according to claim 3, wherein the reinforcing films have the shape of a triangle or quadrangle, and the reinforcing films are adjacent with their one sides facing to each other.

9. The semiconductor device according to claim 1, wherein the reinforcing film shields a rays.

10. The semiconductor device according to claim 1, wherein the reinforcing film is formed separately from the wiring pattern.

11. The semiconductor device according to claim 1, wherein the film substrate is made of insulating material such as polyimide resin and polyester resin.

12. The semiconductor device according to claim 1, wherein the reinforcing film is a metallic film which is made of metal.

13. A wiring substrate comprising:
a film substrate having a wiring pattern that includes at least one inner lead as a terminal portion; and
a reinforcing film,
wherein the reinforcing film, made of material having a smaller coefficient of linear thermal expansion than the film substrate, is formed on the film substrate in a region where the wiring pattern is not formed and capable of substantially preventing the film substrate from expanding,
wherein a semiconductor element and the wiring pattern are connected to each other by a thermo-compressed bonded connection formed by thermo-compression bonding electrodes of the semiconductor element to inner leads of the wiring pattern, the semiconductor element being provided with a plurality of the electrodes for input and output of an electric signal on the periphery of a bottom surface of the semiconductor element, the inner leads are aligned at positions corresponding to the respective electrodes,
where said bonded connection is such that at least one inner lead of the wiring pattern directly contacts an electrode of the semiconductor element, wherein said reinforcing film is bonded onto the film substrate and has sides, at least one of which extends along a direction in which the inner leads are provided, and wherein the height of the reinforcing film, measured from the surface of the film substrate on which the reinforcing film is formed, is one-third to two-thirds of the height of the wiring pattern.

14. A semiconductor device comprising:
(a) a semiconductor element, which is provided with a plurality of bump electrodes for input and output of an electric signal on the periphery of a bottom surface of the semiconductor element; and
(b) a wiring substrate which is provided with:
a film substrate,
a wiring pattern formed on the film substrate and having at least one inner lead as a terminal portion, and
a reinforcing film, made of material having a smaller coefficient of linear thermal expansion than the film substrate, and formed in a region where the wiring pattern is not formed on at least one surface of the film substrate and capable of substantially preventing the film substrate from expanding;
wherein the semiconductor element is connected to the wiring pattern, and the semiconductor element and the wiring substrate are sealed with a resin,
wherein the semiconductor element has a bump electrode at a connecting section to the wiring pattern, and the semiconductor element and the wiring pattern (i) electrically connected with each other by connection of the bump electrode and the wiring pattern, and, (ii) after the bump electrode and the wiring pattern are connected, sealed with the resin supplied to a spacing between the semiconductor element and the wiring substrate,
wherein said connection between the semiconductor element and the wiring pattern is a thermo-compressed bonded connection formed by thermo-compression bonding the bump electrodes of the semiconductor element to inner leads of the wiring pattern, the inner leads are aligned at positions corresponding to the respective bump electrodes,
wherein said bonded connection is such that at least one inner lead of the wiring pattern directly contacts the respective bump electrode of the semiconductor element,
wherein said reinforcing film is bonded onto the film substrate, and has sides, at least one of which extends along a direction in which the inner leads are provided, and
wherein the height of each reinforcing film, measured from the surface of the film substrate on which the respective reinforcing film is formed, is one-third to two-thirds of the height of the wiring pattern.

15. The semiconductor device according to claim 14, wherein the reinforcing film is on that surface of the film substrate on which the wiring pattern is formed.

16. The semiconductor device according to claim 14, wherein the reinforcing film and the wiring pattern are made of the same material.

17. The semiconductor device according to claim 1, wherein at least one of the sides of the reinforcing film is parallel to a direction in which the inner leads are provided.

18. The semiconductor device according to claim 1, wherein the reinforcing film is a single section having the shape of a quadrangle.

19. The semiconductor device according to claim 13, wherein at least one of the sides of the reinforcing film is parallel to a direction in which the inner leads are provided.

20. The semiconductor device according to claim 13, wherein the reinforcing film is a single section having the shape of a quadrangle.

21. The semiconductor device according to claim 14, wherein at least one of the sides of the reinforcing film is parallel to a direction in which the inner leads are provided.

22. The semiconductor device according to claim 14, wherein the reinforcing film is a single section having the shape of a quadrangle.

* * * * *